(12) United States Patent
Cisnero et al.

(10) Patent No.: US 10,138,097 B2
(45) Date of Patent: Nov. 27, 2018

(54) HOIST ASSEMBLY AND METHOD OF LIFTING

(71) Applicant: The Boeing Company, Chicago, IL (US)

(72) Inventors: Jose L. Cisnero, Marysville, WA (US); Kenneth L. McElhaney, Kent, WA (US); Robert W. Dost, Kent, WA (US); Kate A. Ackerman, Seattle, WA (US); Anthony Todd Lefkowicz, Seattle, WA (US); Jarrod P. Ming, Auburn, WA (US); Phillip W. Rogen, Bonney Lake, WA (US); Dale R. Tallyn, Tacoma, WA (US); Andrew B. Mgebroff, Kent, WA (US); Christopher J. Sanchez, Seattle, WA (US); Tracy M. Brown, Renton, WA (US)

(73) Assignee: The Boeing Company, Chicago, IL (US)

( * ) Notice: Subject to any disclaimer, the term of this patent is extended or adjusted under 35 U.S.C. 154(b) by 414 days.

(21) Appl. No.: 14/933,061

(22) Filed: Nov. 5, 2015

(65) Prior Publication Data
US 2017/0129751 A1    May 11, 2017

(51) Int. Cl.
*B66C 23/00* (2006.01)
*B66C 23/20* (2006.01)
(Continued)

(52) U.S. Cl.
CPC ............ *B66C 23/201* (2013.01); *B64D 43/00* (2013.01); *B66C 23/04* (2013.01); *B66C 23/18* (2013.01); *H05K 7/18* (2013.01)

(58) Field of Classification Search
CPC ..... B66C 23/18; B66C 23/185; B66C 23/201; B66C 23/205; B66C 23/207; B66C 13/08; B66D 3/08; B66D 3/18
See application file for complete search history.

(56) References Cited

U.S. PATENT DOCUMENTS 4,003,479 A * 1/1977 Reyer .................. A61G 7/1017
                                                      212/285
4,005,852 A * 2/1977 Schmitmeyer .......... B66C 23/18
                                                      212/278
(Continued)

OTHER PUBLICATIONS

Posilift Lifting and Positioning Equipment, Servo Hoists, http://www.posilift.com/details.php?ssi=53, printed Jul. 2, 2015.
(Continued)

*Primary Examiner* — Emmanuel M Marcelo
(74) *Attorney, Agent, or Firm* — Ostrager Chong Flaherty & Boritman PC

(57) ABSTRACT

A removable hoist assembly for lifting a load up and into a confined space in the form of a kit has a support structure releasably coupled to overhead structural beams in the confined space, a motor releasably coupled to the support structure above the support structure between the overhead structural beams, a hoist arm releasably coupled to the support structure to be rotatable and extendable with respect to the support structure, and a cable supported by the hoist arm. The cable has a free end positioned proximate a distal end of the hoist arm and configured to couple to the load and a terminal end coupled to the motor such that the cable extends and retracts with respect to the motor. The hoist arm support structure spreads the weight of the motor, hoist arm and the load across a plurality of the overhead structural beams.

23 Claims, 10 Drawing Sheets

(51) Int. Cl.
    *B66C 23/04*     (2006.01)
    *B66C 23/18*     (2006.01)
    *B64D 43/00*     (2006.01)
    *H05K 7/18*     (2006.01)

(56) References Cited

U.S. PATENT DOCUMENTS

| | | | | |
|---|---|---|---|---|
| 4,216,947 | A * | 8/1980 | Chausse | B66C 1/42 |
| | | | | 269/208 |
| 2007/0163982 | A1* | 7/2007 | Lichinchi | B60P 1/5471 |
| | | | | 212/175 |
| 2010/0011575 | A1* | 1/2010 | Numajiri | B66C 17/04 |
| | | | | 29/889.1 |
| 2012/0168251 | A1* | 7/2012 | Baxter | B66C 23/205 |
| | | | | 182/129 |

OTHER PUBLICATIONS

Electrical Cable Hoist 495/990kg, 18m from Conrad.com, http://www.conrad.com/ce/en/product/888988/Electric-Cable-Hoist-495 . . . , printed Jul. 2, 2015.
Electrical Cable Hoist—200-250kg, 50m—Star Series—GEDA-Dechentreiter GmbH & Co.KG, http://www.directindustry.com/prod/geda-dechentreiter-gmbh-cokg/produ . . . , printed Jul. 2, 2015.
DBI-SALA 2013 Electrical p. 5—Confined Space Safety, Western Safety Products, Inc., http://www.westernsafety.com/products/dbisala13-electrical/dbisala13elec . . . , printed Jul. 2, 2015.
Liftmaster Strongarm Hoist, Fallshaw Wheels & Castors, https://www.fallshaw.com.au/liftmaster/hoists/strongarm_hoist?type=inject, published 2010, printed Jul. 2, 2015.

* cited by examiner

HOIST ASSEMBLY AND METHOD OF LIFTING

TECHNICAL FIELD

This disclosure relates generally to lifting and positioning equipment and, more particularly, to hoists for lifting loads into a confined space, such as an aircraft compartment, removing loads from such confined spaces and/or moving loads within such confined spaces.

BACKGROUND

In manufacturing and/or maintenance and repair environments, it is often necessary to lift heavy, oddly shaped, non-centered equipment into a confined space and then to rotate and position such equipment within the confined space. Confined spaces pose a variety of physical challenges including limited space within the confined space and restricted access to the confined space.

For example, modern aircraft are commonly designed to have one or more electronics bays or other compartments configured within the aircraft fuselage's structural beams below the flight deck. Access to aircraft electronics bays and other compartments is often provided through a relatively small opening in the bottom of the fuselage (i.e., at the bottom of the electronics bay) where an access door is installed. Electronics and other equipment are installed into aircraft electronics bays by lifting the equipment from the floor below the aircraft, up through the opening in the bottom of the fuselage, and then turning and positioning the equipment in the electronics bay. Currently, depending on the size, weight and shape of the equipment, this requires one or more people on the floor outside the fuselage to lift the equipment through the relatively small opening to one or more people inside the electronics bay. Similar lifting and turning procedures and personnel are used for removing equipment from the electronics bay for maintenance and/or repair, and then re-installing the equipment. Throughout these processes, care must be taken not to damage the equipment or the aircraft.

It is therefore desirable to improve the foregoing processes with hoisting capabilities that will reduce the physical challenges associated with confined spaces, provide more precision in handling equipment to be installed in confined spaces, and to provide ergonomic benefits and other manufacturing efficiencies. Although hoists are used generally in various construction and maintenance applications, hoists typically have a motor suspended on an arm. This configuration would be difficult to use in confined spaces of an aircraft because of the size of aircraft compartments, such as electronics bays, and structural elements within the compartments. Other known hoists have the cable and hook directly suspended from the motor. This configuration may be difficult to position in an aircraft compartment and would not allow components to be moved to the proper position within the compartment.

SUMMARY

The foregoing purposes, as well as other purposes that will be apparent, are achieved with a hoist assembly in the form of a kit of components that can be easily and quickly assembled and taken apart in a confined space, and supported by overhead structural beams in the confined space, such as an electronics bay or other compartment in an aircraft fuselage, or any other type of confined space. The hoist assembly is useful for lifting equipment or any other type of load (e.g., tools, electronic boxes, electronic equipment, electronics shelves etc.) into the confined space and positioning the equipment within the confined space during initial installation or re-installation, and lowering such equipment out of the confined space for maintenance, inspection and/or repair. This is particularly useful in the aircraft industry during "C-checks" in which all 200+ components in an electronics bay are removed, inspected and re-installed. The hoist assembly also provides for precise movements to reduce the risk of damaging the equipment being hoisted, any other equipment in the confined space, and the confined space itself.

The hoist assembly comprises a support structure releasably coupled to overhead structural beams in the confined space, a motor releasably coupled to the support structure above the support structure and between the overhead structural beams, a hoist arm releasably coupled to the support structure to be rotatable and extendable with respect to the support structure, and a cable supported by the hoist arm. The cable has a free end positioned proximate a distal end of the hoist arm and configured to couple to the load, and a terminal end coupled to the motor such that the cable extends and retracts with respect to the motor along the hoist arm. As used in this disclosure, the term "releasably coupled" means to temporarily secure one component to another component such as through the use of quick-release fasteners.

The support structure may comprise a single plate, multiple plates or a plurality of frames, and is configured to be supported by a plurality of overhead structural beams. Therefore, the support structure spreads the weight of the motor, hoist arm and the load across a plurality of overhead structural beams. All of the components of the hoist assembly (i.e., the support structure, the motor, the hoist arm and the cable) are lightweight; each preferably less than 15 pounds (6.8 kilograms).

The hoist assembly may be used with a connecting tool configured to be coupled to the free end of the cable and to the load to connect the cable to the load. At least one attachment point is provided on a top or sidewall of the connecting tool that balances the load either in a horizontal or vertical position as it is moved by the hoist assembly. The hoist assembly may also include a pair of bars configured to be coupled adjacent an opening through which the load is moved and act as a platform that supports the load above the opening.

A further aspect of this disclosure is a method of lifting a load into a confined space using the hoist assembly. The method comprises the steps of: releasably coupling a support structure between overhead structural beams in the confined space; releasably coupling a motor to the support structure; releasably coupling a hoist arm to the support structure such that the hoist arm is rotatable and extendable with respect to the support structure; coupling a terminal end of a cable to the motor such that the cable extends and retracts with respect to the motor when operated by the motor and supporting a free end of the cable proximate a distal end of the hoist arm; positioning the distal end of the hoist arm above the load; coupling the free end of the cable to the load; operating the motor to lift the load; and moving the hoist arm to position the load within the confined space. A connecting tool may be coupled to the free end of the cable and to the load to connect the cable to the load.

In a further embodiment of the method, a pair of bars may be coupled adjacent an opening through which the load is moved into the confined space. The free end of the cable is coupled to a first attachment point on a side of a connecting tool. The motor is operated to lift the load in a vertical position through the opening, the load may be rotated to a horizontal position and placed onto the pair of bars to support the load above the opening inside the confined space. The free end of the cable is released from the first attachment point, and coupled to a second attachment point on a top of the connecting tool; and the motor is operated to lift the load in the horizontal position and the hoist arm is moved to position the load within the confined space.

Further areas of applicability and advantages of the disclosed hoist assembly will become apparent when the detailed description is considered in conjunction with the following drawings. It should be understood that the detailed description and specific examples are intended for purposes of illustration only and are not intended to limit the scope of the disclosure.

BRIEF DESCRIPTION OF THE DRAWINGS

Various embodiments will be hereinafter described with reference to drawings for the purpose of illustrating the foregoing and other aspects of the disclosure.

DETAILED DESCRIPTION

In the following detailed description, various embodiments of a hoist assembly apparatus and methods of lifting a load in a confined space are described to illustrate the general principles of the present disclosure. The disclosed apparatus, systems and methods are suitable for use in a wide variety of aircraft and aerospace applications. This disclosure is merely exemplary in nature and is in no way intended to limit the scope of the disclosed apparatus, systems and methods, their applications or their uses. It will also be immediately recognized by one skilled in the art that the present disclosure may be practiced in other analogous applications or environments and/or with other analogous or equivalent variations of the illustrative embodiments. For example, the disclosed hoist assembly apparatus and methods of lifting a load in a confined space are just as readily adapted for use with ground-based confined spaces wherein the ability to lift, move and position heavy, oddly shaped, non-centered equipment in the confined space is desired. It should also be noted that those methods, procedures, components, or functions which are commonly known to persons of ordinary skill in the field of the disclosure are not described in detail herein.

Figure 1:
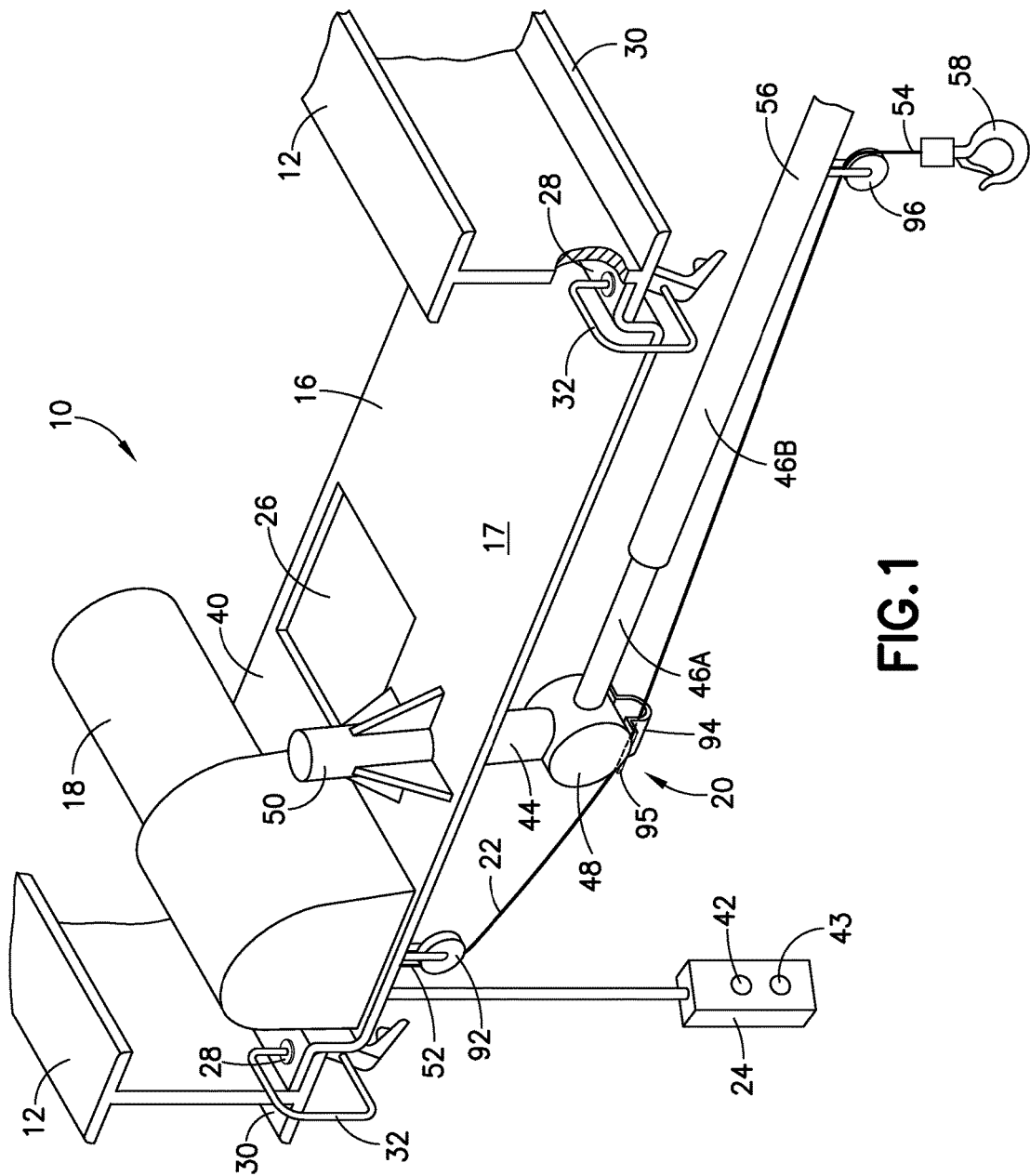
FIG. 1 is a perspective view of a hoist assembly releasably coupled to overhead structural beams (partially shown).
Figure 2:
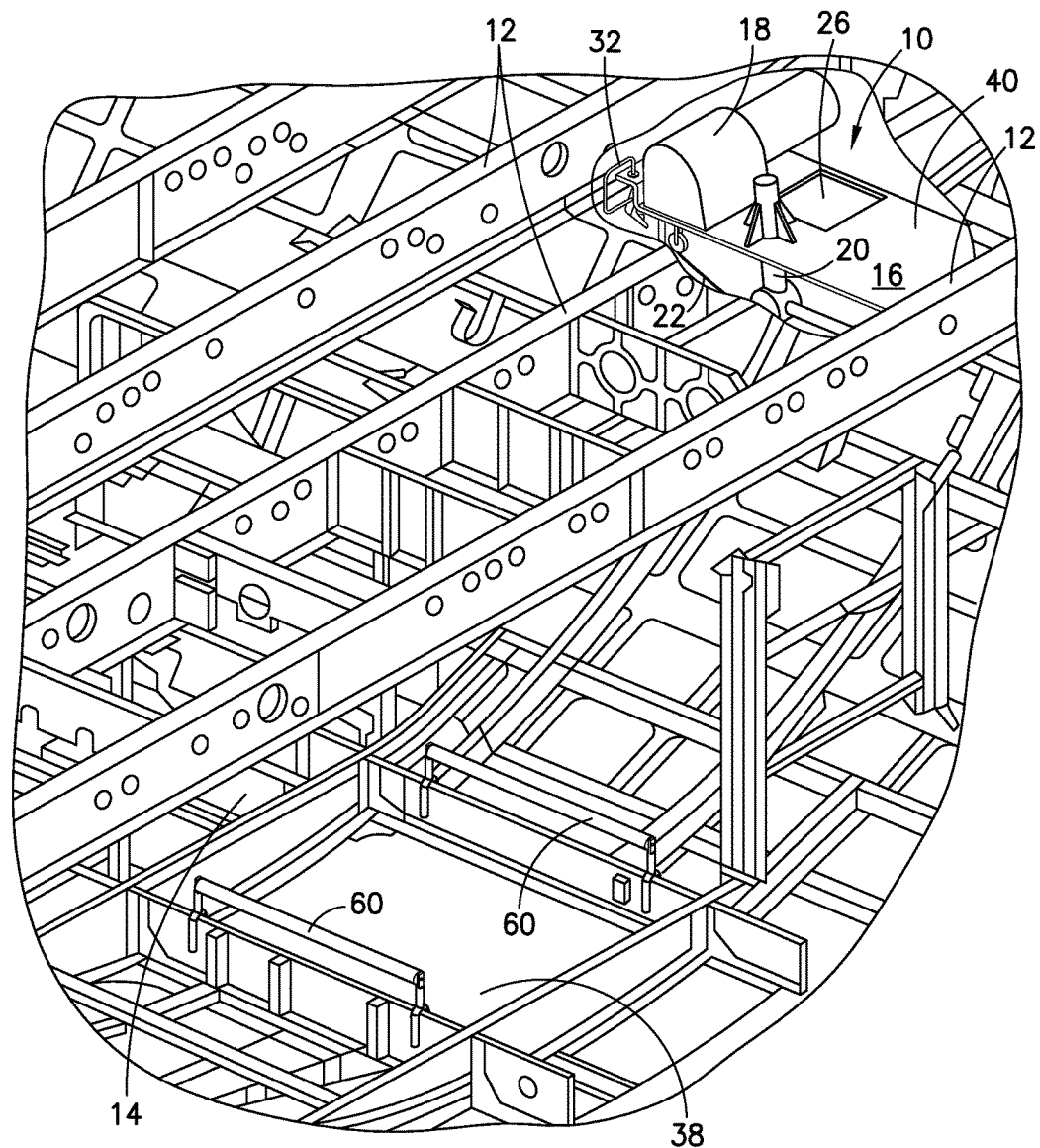
FIG. 2 is a perspective view of structural elements of an electronics bay in an aircraft incorporating the hoist assembly shown in FIG. 1.
Figure 3:
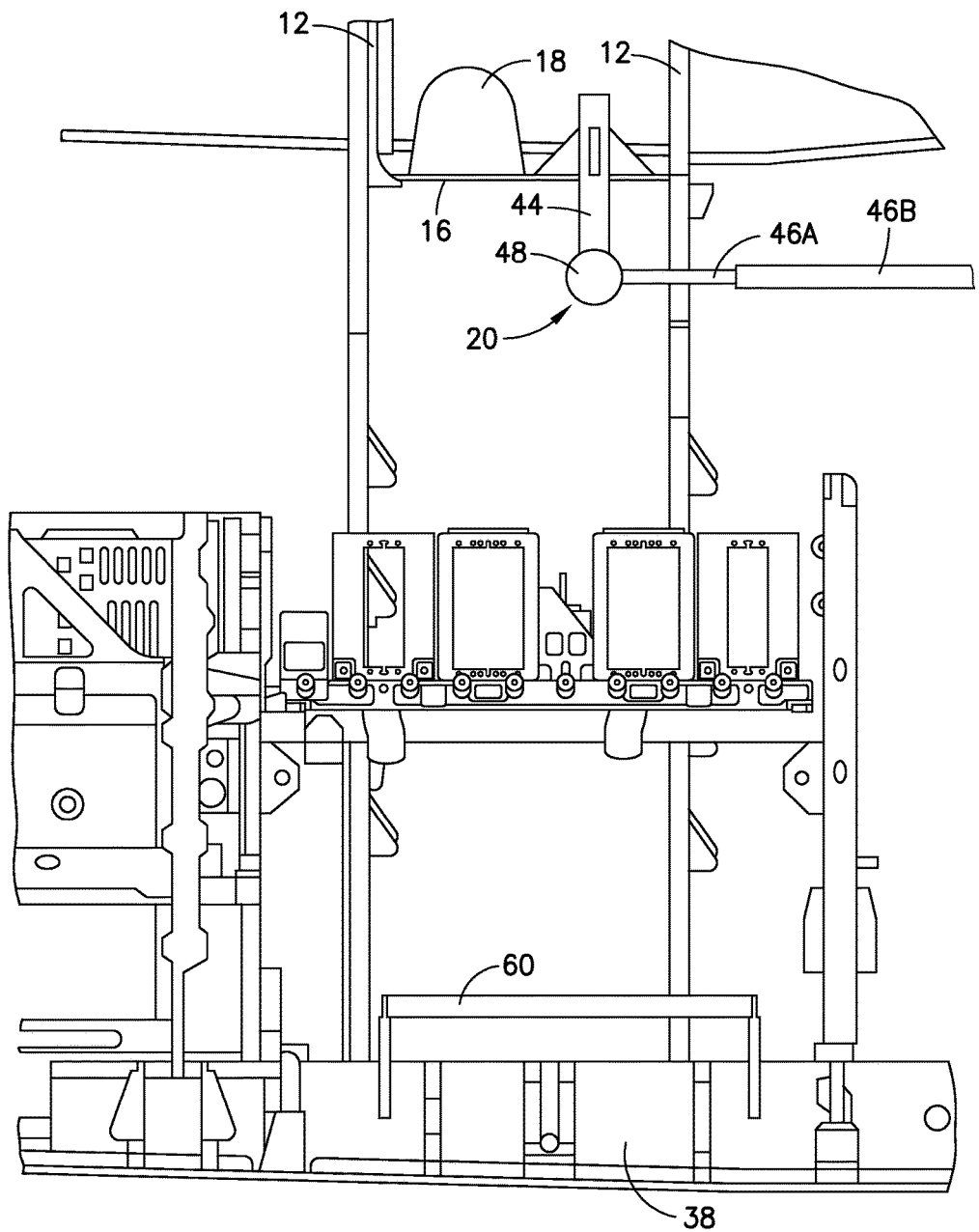
FIG. 3 is a side elevation view of a portion of an electronics bay in an aircraft incorporating the hoist assembly shown in FIG. 1.
Figure 4:
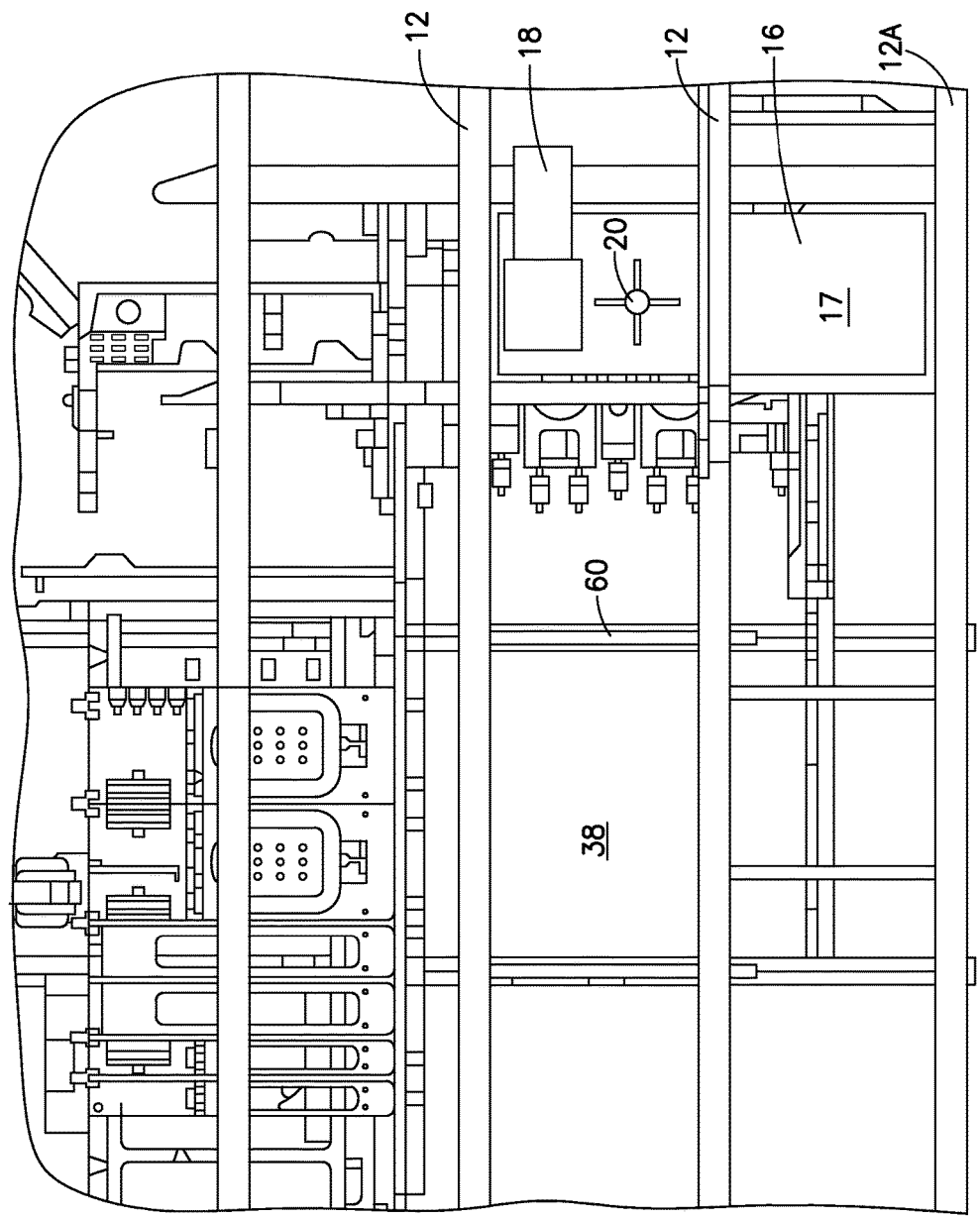
FIG. 4 is a top view of a portion of an electronics bay in an aircraft incorporating the hoist assembly shown in FIG. 1.

Referring more particularly to the drawings, FIG. 1 shows a hoist assembly 10 in assembled form and releasably coupled to overhead structural beams 12 (shown partially) as may be found in a confined space 14 or any other type of structure formed with structural beams. As used herein, "overhead structural beams 12" means any structural beams that are above the area where the hoist assembly 10 is to be installed. The overhead structural beams 12 are shown as having an I-shaped cross-section, but the hoist assembly 10 may be readily adapted to be releasably coupled to beams having other cross-sectional shapes. FIGS. 2-4 show various views of a confined space 14 such as an electronics bay in a lower portion of an aircraft fuselage having the hoist assembly 10 installed between overhead structural beams 12 that are positioned in the fuselage as floor beams for the upper passenger cabin of the aircraft. The hoist assembly 10 may be used in any other type of confined space.

The hoist assembly 10 is provided in the form of a kit of components that can be easily and quickly assembled and taken apart within the confined space 14 including a support structure 16, a motor 18, a hoist arm 20, a cable 22 and a control panel 24. Each of the foregoing components is lightweight, preferably weighing no more than 15 pounds (6.8 kilograms) to ensure that the components may be easily lifted into and installed in the confined space 14 by one person. The components may also be coated to have rubber surfaces, should be free of sharp edges or protrusions, and should be approved for use in an energized environment and have the ability to hoist electrostatic protected equipment.

The support structure 16 is shown in FIG. 1 as a solid plate 17 having an optional aperture 26. The aperture 26 facilitates installation of the motor 18 and hoist arm 20, providing a space for an installer to reach through the solid plate 17, but the aperture 26 is not required. FIG. 4 shows the solid plate 17 with no aperture.

The support structure 16 is configured to be releasably coupled to the overhead structural beams 12. Referring to FIG. 1, the plate 17 has elevated flanges 28 at both ends of the plate 17 that co-act with lower flanges 30 in the overhead structural beams 12 to support the plate 17. The elevated flanges 28 have a depth (from an end of the plate 17) that is substantially equal to a depth of the lower flanges 30 in the overhead structural beams 12. The support structure 16 may have a length substantially equivalent to the space between two adjacent overhead structural beams 12 as shown in FIG. 1, or the length of the support structure 16 may extend beyond one of the two adjacent overhead structural beams 12 to a third adjacent structural beam 12A as shown in FIG. 4.

Figure 5:
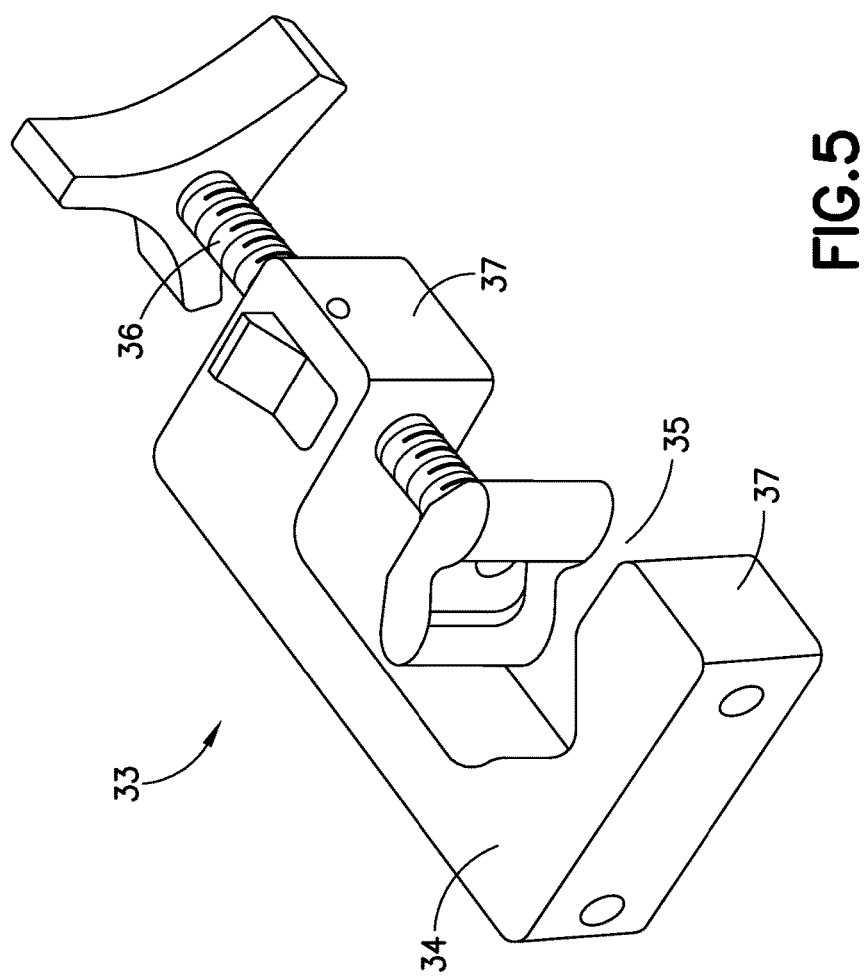
FIG. 5 is a perspective view of a quick-release clamp for use with the hoist assembly shown in FIG. 1.

The support structure 16 is releasably coupled to the overhead structural beams 12 by any type of quick-release coupling mechanism 32 capable of temporarily securing the components together without the need for tools. For example, referring to FIG. 5, a quick release clamp 33 having a generally C-shape frame 34 (e.g., a frame 34 having an at least partially arcuate shape with a gap 35 defined between adjacent ends 37 of the frame 34) and locking finger 36 may be used. Ends 37 of the C-shape frame 34 are placed on an upper surface of the elevated flanges 28 and a lower surface of the lower flange 30 and the locking finger 36 is closed (by rotating it) to clamp the elevated flanges 28 and lower flange 30, together. Many other types of quick release coupling mechanisms 32 may be used such as manual toggle clamps, hold down claims (with vertical or horizontal handles), latch clamps, straight action or squeeze action clamps of the type, for example, available from DE-STA-CO, A Dover Company, Auburn Hills, Mich. The locking finger 36 may be positioned above or below the support structure 16. Preferably, a quick release coupling mechanism 32 is placed at each corner of the support structure 16 to spread the weight of the hoist assembly 10 and the load between the overhead structural beams 12. In embodiments where the support structure 16 extends to a third adjacent structural beam 12A as shown in FIG. 4, additional quick release coupling mechanisms 32 may be used at the central of the overhead structural beams 12. For example, either two or four additional quick release coupling mechanisms 32 may be used to further spread the weight of the hoist assembly 10 and load.

In other embodiments, the support structure 16 may be in the form of two or more plates 17 connected together with guide pins and quick release fasteners to hold the two or more plates 17 together. Alternatively, the support structure 16 may be in the form of two or more frames clamped to the overhead structural beams 12 and extending between two or three adjacent overhead structural beams 12.

The support structure 16 is preferably installed off center from an access hatch 38 in the confined space 14, as shown in FIG. 2 to provide sufficient room in the confined space 14 for a person to operate the hoist assembly 10.

The motor 18 is releasably coupled to the support structure 16 either on the lower surface or the upper surface 40 of the support structure 16. Preferably, the motor 18 is installed above the support structure 16 such that the motor 18 is between the overhead structure beams 12 and out of the way in the confined space 14. Any type of electric motor may be used that is lightweight, preferably less than 15 pounds (6.8 kilograms), and capable of acting as a winch to extend and retract the cable 22 with a lifting capacity of no less than 100 pounds (45.3 kilograms). The motor 18 is controlled by a control panel 24 with a start button 42 and a stop button 43, and should have sufficient speed control to fine tune the ability to position a load in the confined space 14. The motor 18 may be selectively coupled with any type of quick release coupling mechanism 32, such as clamps, bolts, slots with keyways, and locked with a pin or other locking device to secure the motor 18 in place on the support structure 16. The aperture 26 in the plate 17 may be used to install and temporarily secure the motor 18 to the plate 17 via the quick release coupling mechanism 32.

Figure 6:
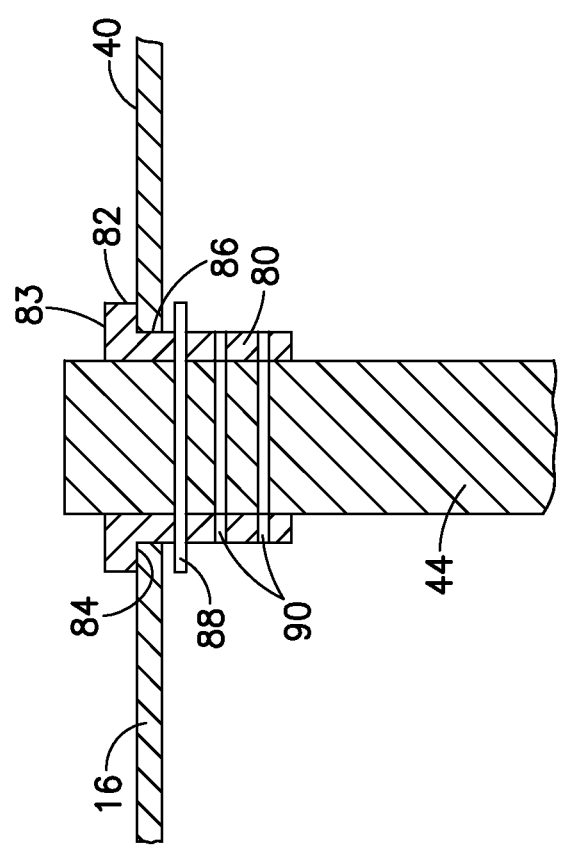
FIG. 6 is an illustration of a coupling between a support plate and a vertical shaft of a hoist arm in the hoist assembly.

The hoist arm 20 is releasably coupled to the support structure 16 and is configured to be rotatable and extendable in vertical and horizontal directions with respect to the support structure 16. In one embodiment, the hoist arm 20 has an L-shape configuration defined by a vertical shaft 44 extending down from the support structure 16 and a horizontal swing arm 46 connected to a distal end of the vertical shaft 44 at a hub 48 and extending in a direction substantially parallel to the support structure 16. The vertical shaft 44 and the horizontal swing arm 46 may be removably coupled to each other with any type of quick release coupling mechanism. The vertical shaft 44 is temporarily secured to the support structure 16 such that the vertical shaft 44 is rotatable with respect to the support structure 16. For example, referring to FIG. 6, a rotatable collar 80 having a cylindrical shape with a central hole longitudinally through the cylindrical shape and a flange 82 extending around an upper peripheral edge of the cylindrical shape is positioned through a hole in the support structure 16 such that a lower surface 84 of the flange 82 rests on an upper surface 40 of the support structure 16. Bearings may be positioned on an outer surface 86 of the collar 80 proximate the support structure 16 and/or on the lower surface 84 of the flange 82 to provide free horizontal rotation of the collar 80 within the hole in the support structure 16. The vertical shaft 44 is positioned through the central hole in the collar 80 and releasably coupled to the collar 80 via a quick release locking pin 88 extending horizontally through the collar 80 and the vertical shaft 44. Several vertically aligned holes 90 may be provided in the collar 80 and the vertical shaft 44 to allow for height adjustment of the vertical shaft 44.

In an alternative embodiment, the vertical shaft 44 may include a screw thread (not shown) at a top end of the vertical shaft 44 which can be inserted through the collar 80 in the support structure 16 such that the vertical shaft 44 is positioned below the support structure 16 and the screw thread extends up from the upper surface 40 of the plate 17. A bolt 50 is installed onto the screw thread and the bolt 50 rests on a top surface 83 of the flange 82. The bolt may be temporarily secured to the collar to permit rotation of the bolt 50 and vertical shaft 44. In another alternative embodiment, the horizontal swing arm 46 may be coupled to the vertical shaft 44 in such a way that the horizontal swing arm 46 rotates about the vertical shaft 44.

In addition to the height adjustment of the vertical shaft 44 relative to the support plate 16, the vertical shaft 44 may be configured with a telescoping function to provide further adjustment of the height of the hoist arm 20. For example, the vertical shaft 44 may comprise inner and outer concentric shafts, the inner concentric shaft coupled to the support structure 16 as described above and the outer concentric shaft coupled to the hub 48. The inner and outer concentric shafts have two or more vertically aligned holes at various elevations for insertion of a locking pin through the concentric shafts (similar to the locking pin 88 described above), or the inner shaft can include a depressible button that is selectively inserted into one or more vertically aligned holes at various elevations in the outer shaft, to adjust the vertical height of the hub 48.

The horizontal swing arm 46 is also configured with a telescoping function similar in structure to the structure of the telescoping function in the vertical shaft 44 to permit the horizontal swing arm 46 to extend and retract in a horizontal direction. An inner concentric shaft 46A is coupled to the hub 48 and an outer concentric shaft 46B moves along the inner concentric shaft 46A, and may be locked in position with pins or depressible buttons as described above. The rotatable and extendable hoist arm 20 permits the hoist arm 20 to move in the X, Y and Z directions to fine tune the ability to position a load in the confined space 14. Limit switches are provided in the vertical shaft 44 and horizontal swing arm 46 to restrict motion in the X, Y and Z directions and avoid contact with other structures in the confined space 14. The hoist arm 20 is described with manually adjusted telescoping and rotating movements. In other embodiments, electrical and/or hydraulic controls may be used to rotate or extend the hoist arm 20.

Referring again to FIG. 1, a cable 22 is provided with a terminal end 52 that is coupled to the motor 18 and a free end 54 that is positioned proximate a distal end 56 of the horizontal swing arm 46 of the hoist arm 20 such that the distal end 56 can be coupled to a load. The cable 22 is supported under the horizontal swing arm 46 of the hoist arm 20 by a first pulley 92 temporarily secured to a bottom surface of the support structure 16 proximate the motor 18, one or more cable guides 94 having an arcuate shape with end flanges 95 for temporarily securing the cable guide 94 to the hub 48 or the horizontal swing arm 46 of the hoist arm 20, and a second pulley 96 temporarily secured proximate the distal end 56 of the horizontal swing arm 46 of the hoist arm 20. When operated, the motor 18 extends or retracts the cable 22 with respect to the motor 18. The free end 54 of the cable 22 may be configured with a hook 58 for coupling to the load to be hoisted. The hoist assembly 10 may be used to hoist any type of load. When employed in an electronics bay of an aircraft, the hoist assembly 10 can be used to lift and position electronic equipment and shelves, tools, electronic boxes, baskets or slings for holding tools, or any other equipment that needs to be installed in the electronics bay. The cable 22 may be made from any material suitable for hoisting loads of at least 100 pounds (45.3 kilograms). For example, the cable 22 may be a metallic material with or without a non-metallic protective coating for protecting the load and surrounding structures and equipment in the confined space 14.

The hoist assembly 10 is designed to be installed into the confined space 14 without any specialized tools by a single person, who may stay in the confined space to operate the hoist assembly 10. During operation, a second person outside the confined space 14 (e.g., below the confined space 14 on the ground) connects the hook 58 at the free end 54 of the cable 22 to a load, the single person inside the confined space 14 operates the motor 18 to retract the cable 22 and lift the load through the access hatch 38 or opening in the confined space 14 and then rotates the vertical shaft 44 of the hoist arm 20 and adjusts the extension of the vertical shaft 44 and the horizontal swing arm 46 to position the load in a desired location within in the confined space 14.

Figure 7:
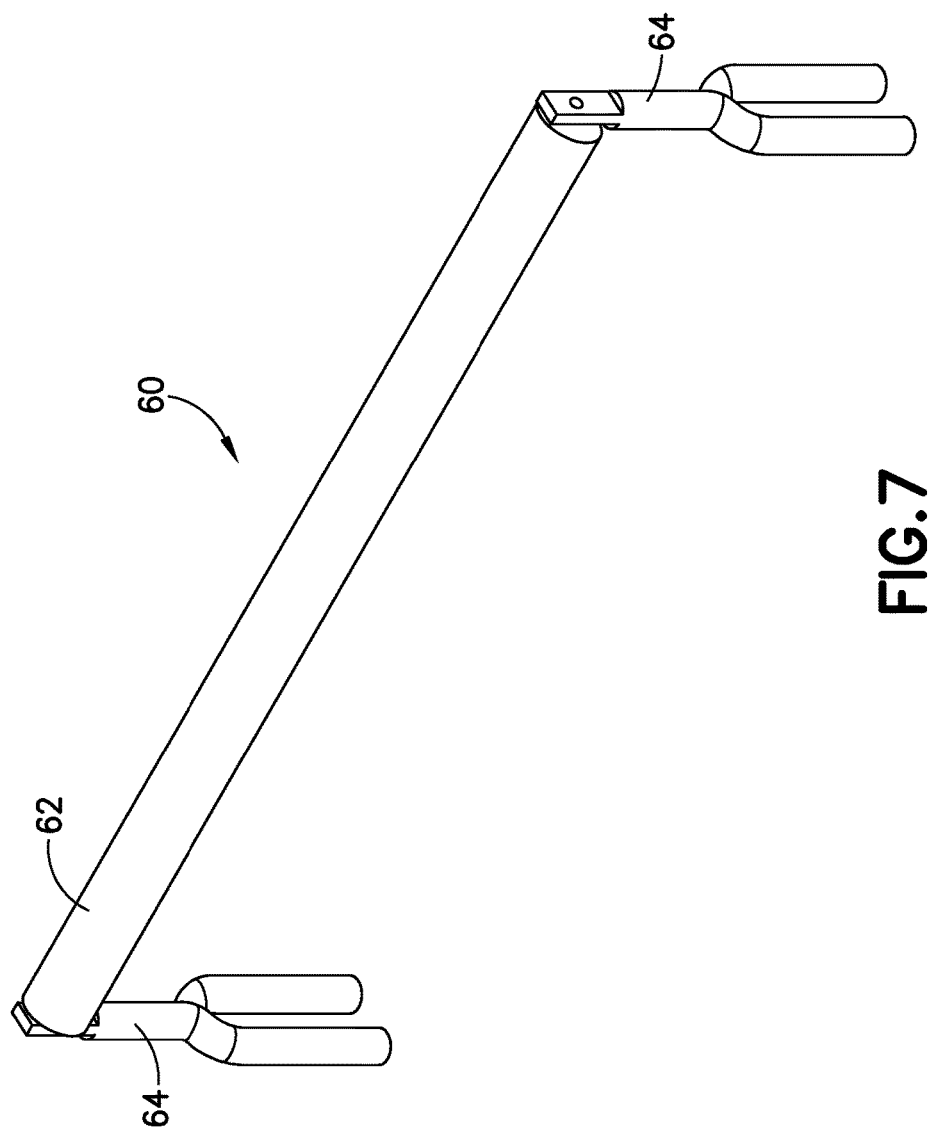
FIG. 7 is a perspective view of one of a pair of bars that may be coupled adjacent an opening through which a load is hoisted into the confined space using the hoisting assembly shown in FIG. 1.

When a load has a horizontal dimension that is too large to fit through the access hatch 38, the load may be turned on its side and lifted through the access hatch 38 in a vertical orientation. Referring to FIGS. 2 and 7, a pair of bars 60 are configured to be coupled adjacent the access hatch 38 and act as a platform that supports the load above the access hatch 38. Thus, after the load is lifted through the access hatch in a vertical orientation, the load may be set down on the pair of bars 60 in a horizontal orientation to prepare the load for installation in the confined space. The bars 60 are configured like sawhorses with a central bar 62 with a non-metallic covering supported by two fork-shaped holders 64 extending down from ends of the central bar 62. The fork-shaped holders 64 straddle the structural beams surrounding the access hatch 38 to support the pair of bars 60 and provide a sturdy platform for the load once inside the confined space 14. The central bar 62 is preferably made from a lightweight, strong and non-marring material, such as nylon, PVC or other plastic material, to avoid damaging the load.

Figure 8:
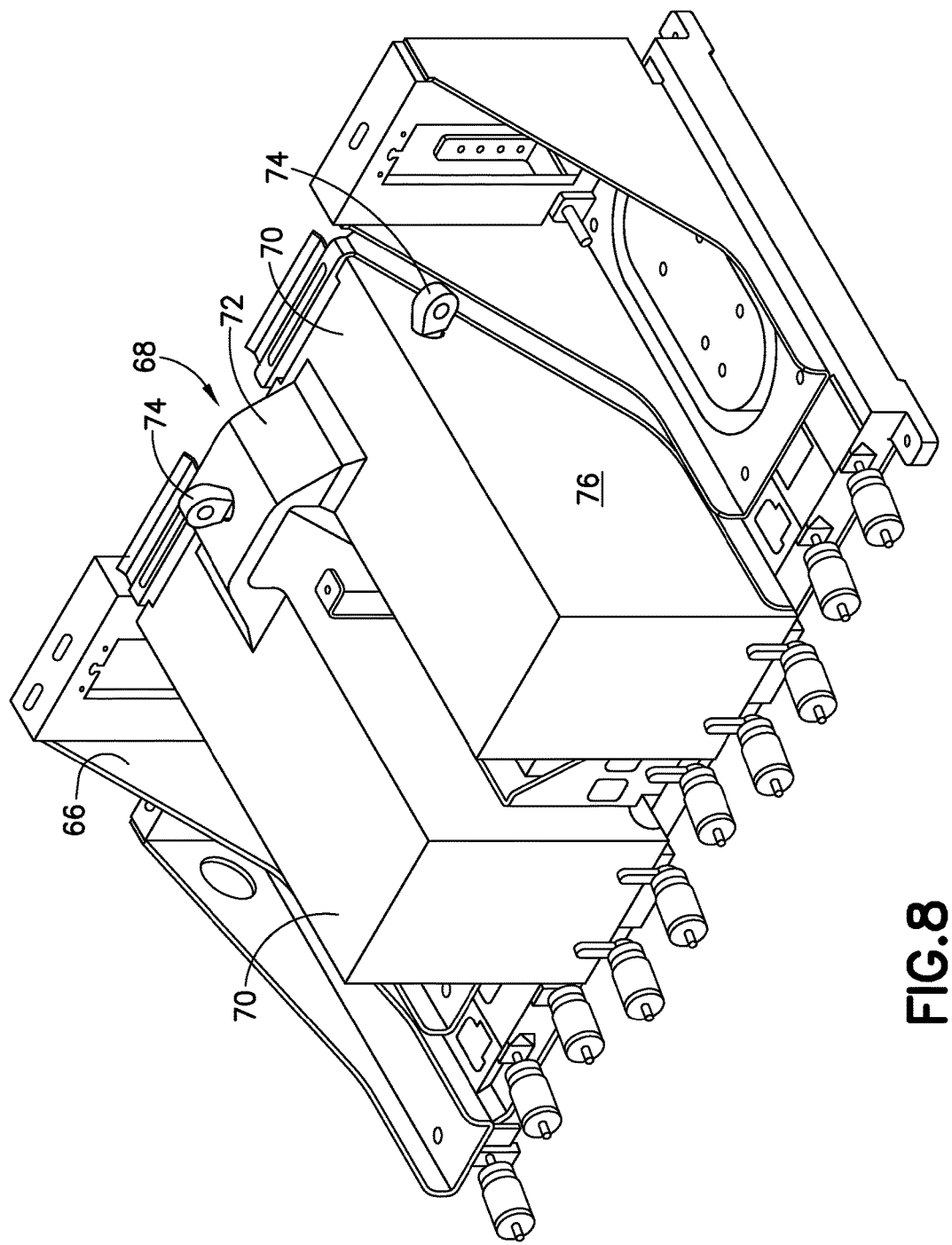
FIG. 8 is a perspective view of an electronic shelf with a connecting tool for coupling to a cable of the hoist assembly shown in FIG. 1.
Figure 9:
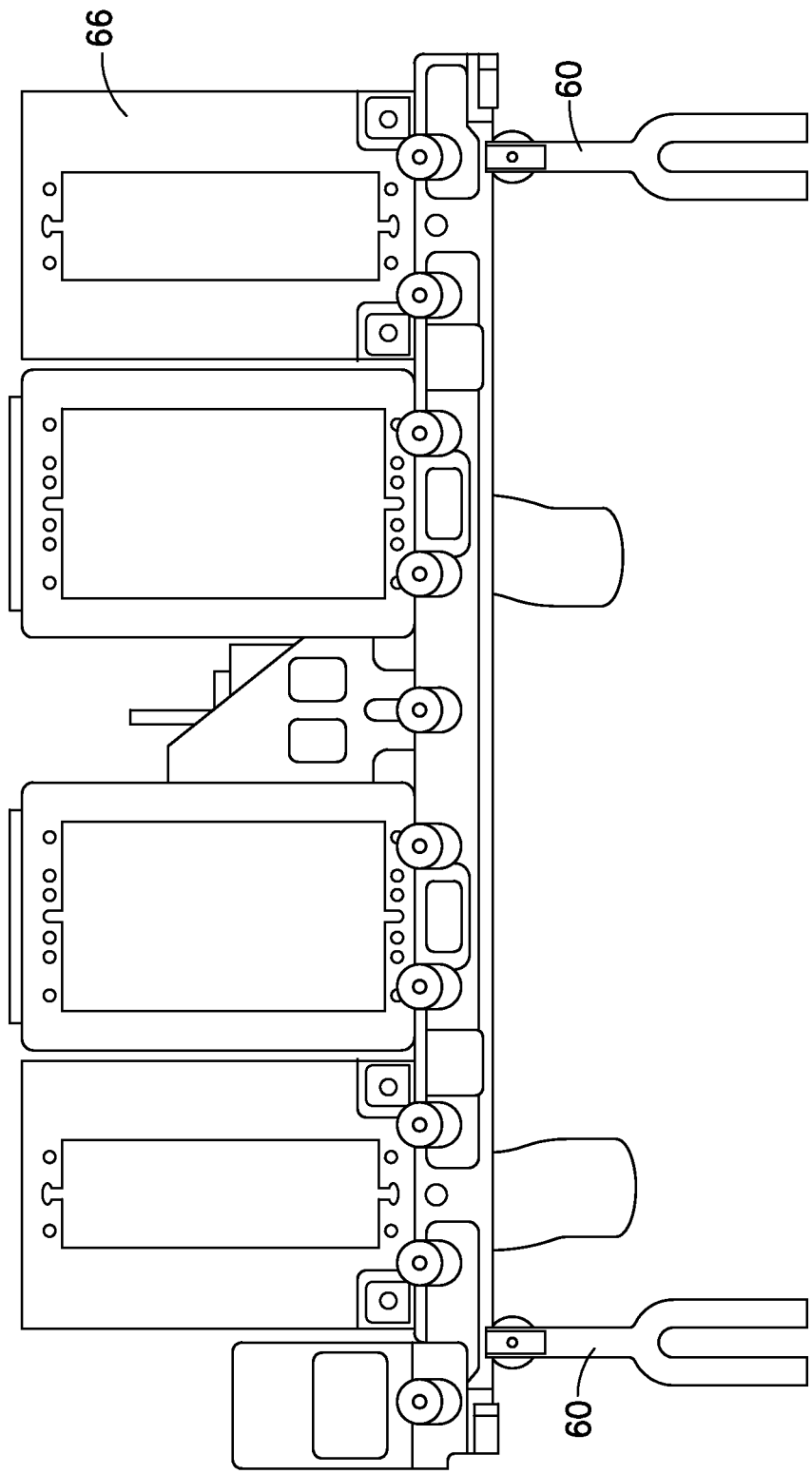
FIG. 9 is a rear elevation view of an electronic shelf positioned on a pair of bars.

For example, electrical shelves 66 of the type shown in FIG. 8 are used in aircraft electronics bays to hold electronic equipment and electrical wiring. When positioned in a horizontal orientation, the shelves 66 do not fit through the access hatch 38 in the aircraft fuselage. Therefore they are typically lifted through the access hatch 38 in a vertical orientation. The hoist assembly 10 includes a connecting tool 68 that may be used for lifting electrical shelves 66 into, and positioning electrical shelves 66 in, an aircraft electronics storage bay.

The connecting tool 68 is configured to be releasably coupled to the free end 54 of the cable 22 and to the load (in this example, the electrical shelves 66) to connect the cable 22 to the load. The connecting tool 68 comprises two boxes 70 having a shape and size similar to electronic boxes that will eventually be coupled to the electrical shelves 66 in the electronics bay. The boxes 70 are connected by a bridge 72, and held in place with extruded metal extending through a hole in the back plate of the electrical shelf 66 and temporarily secured with front hold downs. The connecting tool 68 may be constructed to have other components of configured in other shapes and sizes depending on the size, shape and intended use of the electrical shelves 66.

At least one attachment point 74, and preferably two attachment points 74, is provided to couple the connecting tool 68 to the cable 22. The attachment point 74 balances the load as it is moved by the hoist assembly 10. The attachment points 74 are preferably positioned in a central location on the bridge 72 and/or in a central location on an exterior sidewall 76 of one of the boxes 70. The attachment points 74 can be any type of hook, eye bolt or other device that accepts and securely holds the hook 58 on the cable 22. During operation, the connecting tool 68 is removably coupled to an electrical shelf 66, the hook 58 is coupled to the attachment point 74 on the sidewall 76 of the boxes 70, and the motor 18 is operated to retract the cable 22 and lift the electrical shelf 66 in a vertical orientation through the access hatch 38. After the electrical shelf 66 is lifted inside the aircraft electronics bay (or other confined space 14), the electrical shelf 66 is rotated to a horizontal orientation and placed down on the pair of bars 60. The hook 58 on the cable 22 is then removed from the attachment point 74 on the sidewall 76 and coupled to the attachment point 74 on the bridge 72. The electrical shelf 66 and connecting tool 68 are then lifted off of the pair of bars 60 and positioned and installed in a desired location in the electronics bay by operating the motor 18 and adjusting the hoist arm 20 in the X, Y and/or Z directions as needed. The connecting tool 68 is then removed from the installed electrical shelf 66. For other components, baskets, slings or tools that do not use the connecting tool 68 for lifting into the electronics storage bay, the hook 58 on the cable 22 is coupled directly to the components, baskets, slings or tools and lifted into the electronics storage bay by operating the motor 18 to retract the cable 22 and adjusting the hoist arm 20 in the X, Y and/or Z directions as needed to locate the components, baskets, slings or tools in a desired location within the electronics storage bay.

Figure 10:
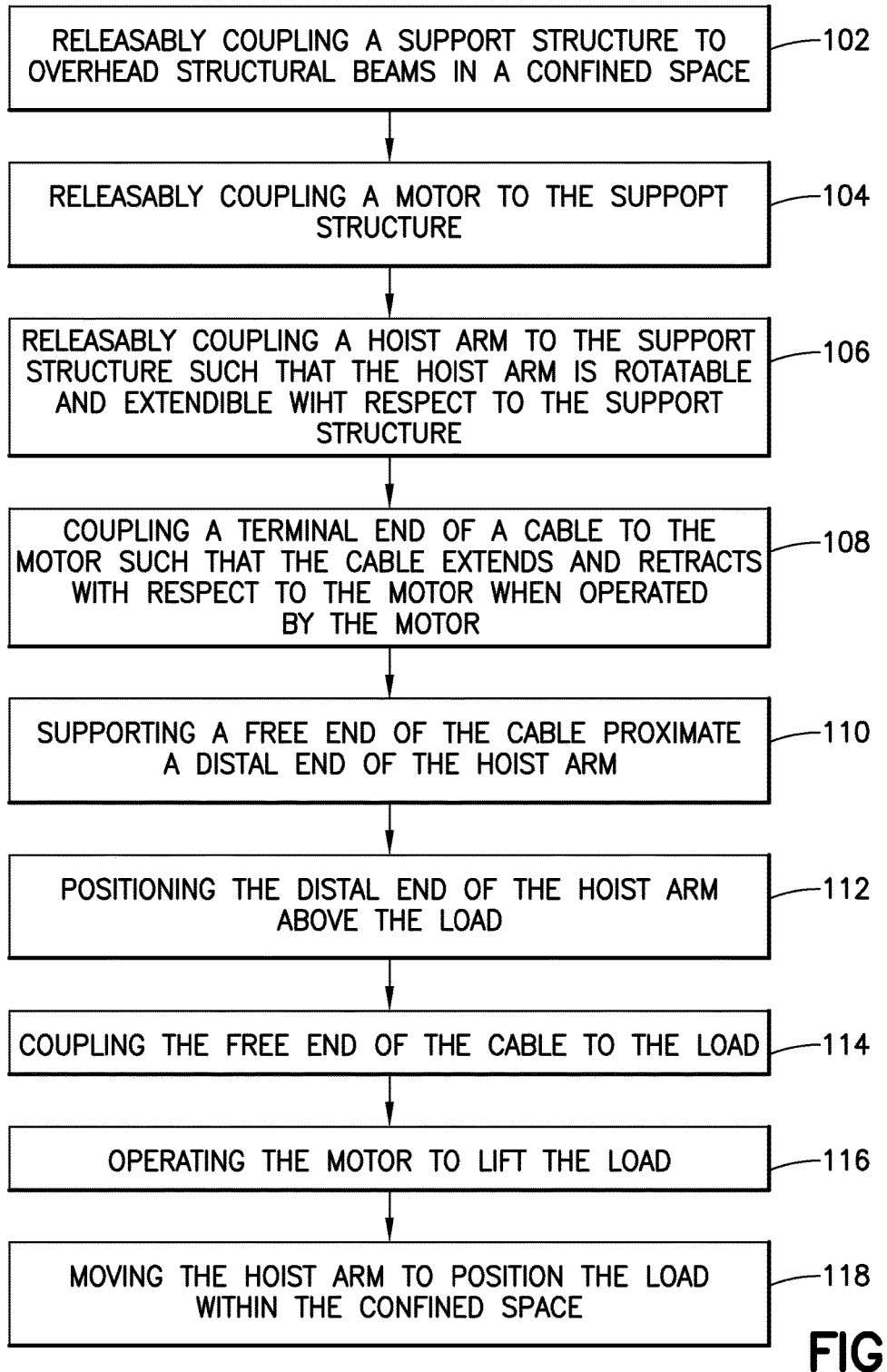
FIG. 10 is a flow diagram of a method of lifting a load into a confined space in an aircraft.

Referring to FIG. 10, the hoist assembly 10 may be used in a method 100 of lifting a load into a confined space 14. In step 102 of the method 100, a support structure 16 is lifted into the confined space 14 and releasably coupled to overhead structural beams 12 in the confined space 14. In step 104, a motor 18 is lifted into the confined space 14 and releasably coupled to the support structure 16. Step 106 of the method provides for lifting a hoist arm 20 into the confined space 14 and releasably coupling the hoist arm 20 to the support structure 16 such that the hoist arm 20 is rotatable and extendable with respect to the support structure 16. In steps 108 and 110, a terminal end 52 of a cable 22 is coupled to the motor 18 such that the cable 22 extends and retracts with respect to the motor 18 when operated by the motor 18, and a free end 54 of the cable 22 is supported proximate a distal end 56 of the hoist arm 20.

In step 112 of the method 100, the distal end 56 of the hoist arm 20 is positioned above an access hatch 38 in a lower portion of the confined space 14 and above a load of the floor below the access hatch 38. The motor 18 is operated in step 114 to extend the cable 22 so the free end 54 of the cable 22 can be coupled to the load. In step 116, the motor 18 is operated to retract the cable 22 and lift the load into the confined space 14. The hoist arm 20 is operated in step 118 to extend or retract the vertical shaft 44 in a vertical direction from the support structure 16, to extend or retract the horizontal swing arm 46 in a horizontal direction substantially parallel to the support structure 16, and to rotate the vertical shaft 44, in order to position the load in a desired location within the confined space 14.

Additional aspects of the method 100 include coupling a pair of bars 60 adjacent an opening or access hatch 38 through which the load is moved into the confined space 14; coupling the free end 54 of the cable 22 to a first attachment point 74 on a side 76 of a connecting tool 68; operating the motor 18 to lift the load in a vertical orientation through the access hatch 38; and placing the load onto the pair of bars 60 to support the load in a horizontal orientation above the access hatch 38 inside the confined space 14.

The free end 54 of the cable 22 is then released from the first attachment point 74 on the side 76 of the connecting tool 68 and coupled to a second attachment point 74 on a top of a bridge 74 of the connecting tool 68. The motor 18 is then operated to lift the load in a horizontal orientation, and the hoist arm 20 is operated to position the load in a desired location within the confined space 14.

After the load is positioned within the confined space 14, the free end 54 of the cable 22 is released from the load, the cable 22 is released from the motor 18, the hoist arm 20 is released from the support structure 16, the motor 18 is released from the support structure 16, the support structure 16 is released from the overhead structural beams 12; and the cable 22, the motor 18, the hoist arm 20, and the support structure 16 are removed from the confined space 14.

While the invention has been described with reference to certain exemplary embodiments, such embodiments are for purposes of illustration and not limitation. It will be understood by those skilled in the art that various changes may be made and equivalents may be substituted for elements thereof without departing from the scope of the invention. For example, the hoist assembly may be used in any type of confined space or other type of structure to provide ease of installation and use to any environment. In addition, many modifications may be made to adapt a particular situation to the teachings herein without departing from the essential scope thereof. Therefore it is intended that the claims not be limited to the particular embodiments disclosed. The method claims set forth hereinafter should not be construed to require that the steps recited therein be performed in alphabetical order or in the order in which they are recited, and should not be construed to exclude two or more steps being performed contemporaneously during at least a portion of the duration of one of said steps.

The invention claimed is:

1. A hoist assembly, comprising:
a support structure configured to be releasably coupled to overhead structural beams;
a motor releasably coupled to and positioned above the support structure;
a hoist arm releasably coupled to the support structure, the hoist arm being rotatable and extendable with respect to the support structure; and
a cable supported by the hoist arm, the cable having a free end positioned proximate a distal end of the hoist arm and configured to couple to a load and a terminal end of the cable coupled to the motor such that the cable extends and retracts with respect to the motor.

2. The hoist assembly of claim 1, wherein the motor is positioned between the overhead structural beams.

3. The hoist assembly of claim 1, wherein the support structure comprises a plate having an aperture cut through the plate, and the motor is releasably coupled to an upper surface of the plate.

4. The hoist assembly of claim 1, wherein the support structure comprises two or more frames, and the motor is releasably coupled to upper surfaces of the two or more frames.

5. The hoist assembly of claim 1, wherein the hoist arm comprises an extendable vertical portion releasably coupled to and extending down from the support structure and an extendable horizontal portion extending from a distal end of the vertical portion in a direction substantially parallel to the support structure.

6. The hoist assembly of claim 1, wherein the support structure spreads the weight of the motor, the hoist arm and the load across a plurality of the overhead structural beams.

7. The hoist assembly of claim 1, further comprising a connecting tool configured to be coupled to the free end of the cable and to the load to connect the cable to the load, the connecting tool comprising at least two attachment points for coupling the connecting tool to the cable.

8. The hoist assembly of claim 7, wherein the connecting tool comprises at least one attachment point that balances the load as the load is moved by the hoist assembly.

9. The hoist assembly of claim 1, further comprising a pair of bars configured to be coupled adjacent an opening through which the load is moved and act as a platform that supports the load above the opening.

10. The hoist assembly of claim 1, further comprising quick-release fasteners for releasably coupling the support structure to the overhead structural beams, the motor to the support structure and the hoist arm to the support structure.

11. A method of lifting a load into a confined space, the method comprising the steps of:
releasably coupling a support structure to overhead structural beams in the confined space;
releasably coupling a motor above and to the support structure;
releasably coupling a hoist arm to the support structure such that the hoist arm is rotatable and extendable with respect to the support structure; and
coupling a terminal end of a cable to the motor such that the cable extends and retracts with respect to the motor when operated by the motor and supporting a free end of the cable proximate a distal end of the hoist arm.

12. The method of claim 11, wherein releasably coupling the motor further comprises positioning the motor between the overhead structural beams.

13. The method of claim 11, wherein the support structure comprises a plate having an aperture cut through the plate, and releasably coupling the motor comprises installing the motor through the aperture and releasably coupling the motor to an upper surface of the plate.

14. The method of claim 11, wherein the support structure comprises two or more frames, and releasably coupling the motor comprises releasably coupling the motor to upper surfaces of the two or more frames.

15. The method of claim 11, further comprising the steps of positioning the distal end of the hoist arm above the load;
coupling the free end of the cable to the load;
operating the motor to lift the load; and
moving the hoist arm to position the load within the confined space.

16. The method of claim 11, further comprising coupling a connecting tool to the free end of the cable and to the load to connect the cable to the load.

17. The method of claim 16, wherein coupling the free end of the cable comprises coupling the free end of the cable to an attachment point on the connecting tool that balances the load as the load is moved by the hoist arm.

18. The method of claim 16, further comprising:
coupling a pair of bars adjacent an opening through which the load is moved into the confined space;
coupling the free end of the cable to a first attachment point on a side of the connecting tool;
operating the motor to lift the load in a vertical orientation through the opening; and
placing the load onto the pair of bars to support the load in a horizontal orientation above the opening inside the confined space.

19. The method of claim 18, further comprising:
releasing the free end of the cable from the first attachment point;
coupling the free end of the cable to a second attachment point on a top of the connecting tool;
operating the motor to lift the load in a horizontal orientation; and
operating the hoist arm to position the load within the confined space.

20. The method of claim 11, further comprising, after the load is positioned within the confined space:
releasing the free end of the cable from the load;
releasing the cable from the motor;
releasing the hoist arm from the support structure;
releasing the motor from the support structure;
releasing the support structure from the overhead structural beams; and
removing the cable, the motor, the hoist arm, and the support structure from the confined space.

21. A hoist assembly, comprising:
a support structure configured to be releasably coupled to overhead structural beams;
a motor releasably coupled to the support structure;
a hoist arm being rotatable with respect to the support structure and comprising an extendable vertical portion releasably coupled to and extending down from the support structure and an extendable horizontal portion extending from a distal end of the vertical portion in a direction substantially parallel to the support structure; and
a cable supported by the hoist arm, the cable having a free end positioned proximate a distal end of the hoist arm and configured to couple to a load and a terminal end of the cable coupled to the motor such that the cable extends and retracts with respect to the motor.

22. A hoist assembly, comprising:
a support structure configured to be releasably coupled to overhead structural beams;
a motor releasably coupled to the support structure;
a hoist arm releasably coupled to the support structure, the hoist arm being rotatable and extendable with respect to the support structure;
a cable supported by the hoist arm, the cable having a free end positioned proximate a distal end of the hoist arm and configured to couple to a load and a terminal end of the cable coupled to the motor such that the cable extends and retracts with respect to the motor; and
quick-release fasteners for releasably coupling the support structure to the overhead structural beams, the motor to the support structure, and the hoist arm to the support structure without the need for tools.

23. A method of lifting a load into a confined space, the method comprising the steps of:
releasably coupling a support structure to overhead structural beams in the confined space;
releasably coupling a motor to the support structure;
releasably coupling a hoist arm to the support structure such that the hoist arm is rotatable and extendable with respect to the support structure;
coupling a terminal end of a cable to the motor such that the cable extends and retracts with respect to the motor when operated by the motor and supporting a free end of the cable proximate a distal end of the hoist arm;
coupling a pair of bars adjacent an opening through which the load is moved into the confined space;
coupling the free end of the cable to a first attachment point on a side of a connecting tool coupled to the load;
operating the motor to lift the load in a vertical orientation through the opening; and
placing the load onto the pair of bars to support the load in a horizontal orientation above the opening inside the confined space.

* * * * *